United States Patent
Balan et al.

(10) Patent No.: US 12,009,326 B2
(45) Date of Patent: Jun. 11, 2024

(54) SRAM BIT CELLS WITH THREE-DIMENSIONAL INTEGRATION

(71) Applicant: GlobalFoundries Singapore Pte. Ltd., Singapore (SG)

(72) Inventors: Hari Balan, Singapore (SG); Juan Boon Tan, Singapore (SG); Ramasamy Chockalingam, Singapore (SG); Wanbing Yi, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 134 days.

(21) Appl. No.: 17/584,507

(22) Filed: Jan. 26, 2022

(65) Prior Publication Data
US 2023/0238342 A1     Jul. 27, 2023

(51) Int. Cl.
| | |
|---|---|
| H01L 23/00 | (2006.01) |
| H01L 23/528 | (2006.01) |
| H01L 25/00 | (2006.01) |
| H01L 25/065 | (2023.01) |

(52) U.S. Cl.
CPC .......... *H01L 24/08* (2013.01); *H01L 23/5286* (2013.01); *H01L 24/80* (2013.01); *H01L 25/0657* (2013.01); *H01L 25/50* (2013.01); *H01L 2224/08145* (2013.01); *H01L 2224/80895* (2013.01); *H01L 2224/80896* (2013.01); *H01L 2924/1437* (2013.01)

(58) Field of Classification Search
CPC ....... H01L 25/0657; H01L 2224/08145; H01L 24/80; H01L 2225/06541; H01L 23/481
See application file for complete search history.

(56) References Cited

U.S. PATENT DOCUMENTS

| | | |
|---|---|---|
| 6,620,659 B2 | 9/2003 | Emma et al. |
| 7,763,915 B2 | 7/2010 | Joly et al. |
| 10,811,071 B1 | 10/2020 | Li et al. |
| 11,043,472 B1 | 6/2021 | Dokania et al. |

(Continued)

OTHER PUBLICATIONS

R. Ranica et al., "28nm FDSOI technology sub-0.6V SRAM Vmin assessment for ultra low voltage applications," 2016 IEEE Symposium on VLSI Circuits (VLSI—Circuits), pp. 1-2, doi: 10.1109/VLSIC.2016.7573512 (2016).

(Continued)

*Primary Examiner* — Anthony Ho
*Assistant Examiner* — David J Goodwin
(74) *Attorney, Agent, or Firm* — Thompson Hine LLP

(57) ABSTRACT

Structures for a static random access memory bit cell and methods of forming a structure for a static random access memory bit cell. The structure includes a first field-effect transistor on a first substrate and a second field-effect transistor on a second substrate. The first field-effect transistor includes a first gate, and the second field-effect transistor includes a second gate. The structure further includes a first interconnect structure on the first substrate and a second interconnect structure on the second substrate. The first interconnect structure includes a first metal feature connected to the first gate, and the first metal feature has a first surface. The second interconnect structure includes a second metal feature connected to the second gate, and the second metal feature has a second surface that is connected to the first surface of the first metal feature.

15 Claims, 7 Drawing Sheets

(56) References Cited

U.S. PATENT DOCUMENTS

| | | |
|---|---|---|
| 11,056,454 B2 | 7/2021 | Liu |
| 11,056,468 B1 | 7/2021 | Or-Bach |
| 2012/0228713 A1 | 9/2012 | Chen et al. |
| 2015/0021789 A1* | 1/2015 | Lin .................. H01L 21/76898 |
| | | 438/118 |
| 2019/0147919 A1* | 5/2019 | Liaw ...................... G11C 5/025 |
| | | 257/773 |
| 2021/0074709 A1* | 3/2021 | Liu .................. H01L 21/02013 |
| 2022/0328419 A1* | 10/2022 | Lin ..................... H01L 21/6835 |

OTHER PUBLICATIONS

T. H. Phung et al., "55nm Ultra-low Power (55ULP) Automotive Grade HD SRAM with Sub 0.7V 16Mb Vmin," 2019 Electron Devices Technology and Manufacturing Conference (EDTM), pp. 4-6, doi: 10.1109/EDTM.2019.8731313 (2019).

CoolCube™: A True 3DVLSI Alternative to Scaling—2015—CEA-LETI; available at https://www.youtube.com/watch?v=plkvOonsjDc; pp. 1-4 (May 2021).

C. Liu and S. K. Lim, "Ultra-high density 3D SRAM cell designs for monolithic 3D integration," 2012 IEEE International Interconnect Technology Conference, pp. 1-3, doi: 10.1109/IITC.2012.6251581 (2012).

* cited by examiner

SRAM BIT CELLS WITH THREE-DIMENSIONAL INTEGRATION

BACKGROUND

The present invention relates to semiconductor device fabrication and integrated circuits and, more specifically, to structures for a static random access memory bit cell and methods of forming a structure for a static random access memory bit cell.

Static random access memory (SRAM) may be used, for example, to temporarily store data in a computer system. An SRAM device includes an array of bit cells in which each individual bit cell holds a single bit of data during operation. Each SRAM bit cell may have a six-transistor (6T) design that includes a pair of cross-coupled inverters providing a storage element and a pair of pass-gate transistors connecting the inverters to complementary bit lines. The pass-gate transistors are controlled by word lines, which are used to select the SRAM memory cell for read or write operations. When continuously powered, the memory state of an SRAM device persists without the need for data refresh operations.

Transistors in a SRAM bit cell may exhibit a threshold voltage mismatch and isolation leakage, particularly for low minimum operating voltages (Vmin) and lower power operation. For example, asymmetric variations in well doping due to the effect of random dopant fluctuation on dopant concentration can lead to mismatches between the NMOS transistors participating in the inverters.

Improved structures for a static random access memory bit cell and methods of forming a structure for a static random access memory bit cell are needed.

SUMMARY

In embodiments of the invention, a structure for a static random access memory is provided. The structure includes a first field-effect transistor on a first substrate and a second field-effect transistor on a second substrate. The first field-effect transistor includes a first gate, and the second field-effect transistor includes a second gate. The structure further includes a first interconnect structure on the first substrate and a second interconnect structure on the second substrate. The first interconnect structure includes a first metal feature connected to the first gate, and the second interconnect structure includes a second metal feature connected to the second gate. The first metal feature has a first surface, and the second metal feature has a second surface that is connected to the first surface of the first metal feature.

In embodiments of the invention, a method of forming a structure for a static random access memory is provided. The method includes forming a first field-effect transistor on a first substrate, forming a second field-effect transistor on a second substrate, forming a first interconnect structure on the first substrate, and forming a second interconnect structure on the second substrate. The first field-effect transistor includes a first gate, the second field-effect transistor includes a second gate, the first interconnect structure includes a first metal feature connected to the first gate, and the second interconnect structure includes a second metal feature connected to the second gate. The method further includes bonding a first surface of the first metal feature to a second surface of the second metal feature.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

DETAILED DESCRIPTION

Figure 1:
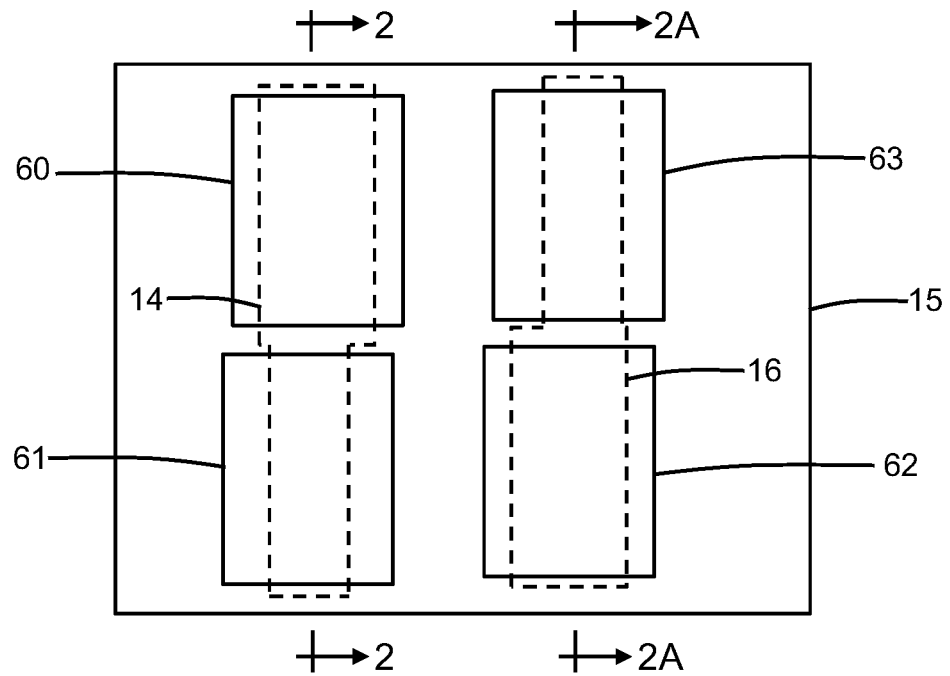
FIG. 1 is a top view of a structure for NMOS transistors that may be used to build a SRAM bit cell in accordance with embodiments of the invention.
Figure 2:
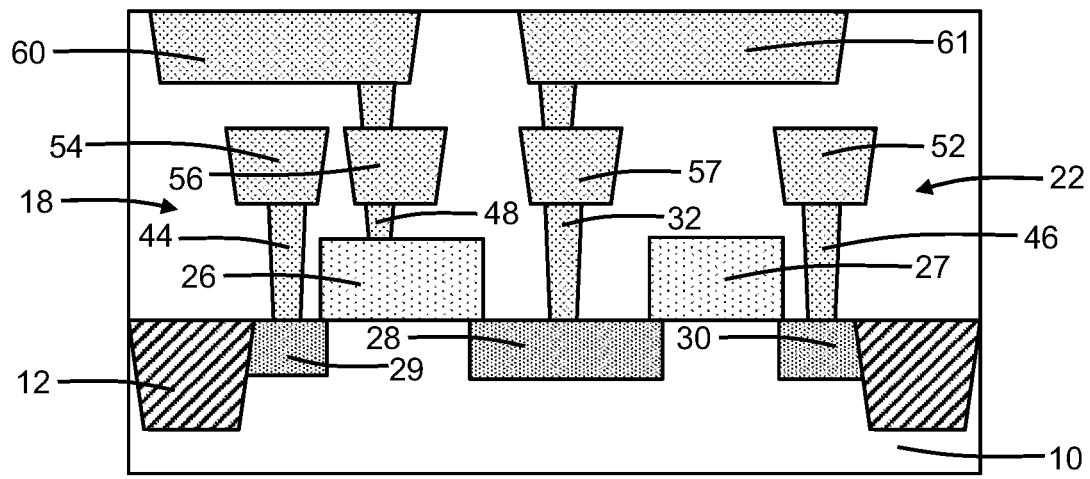
FIG. 2 is a cross-sectional view taken generally along line 2-2 in FIG. 1.
Figure 2A:
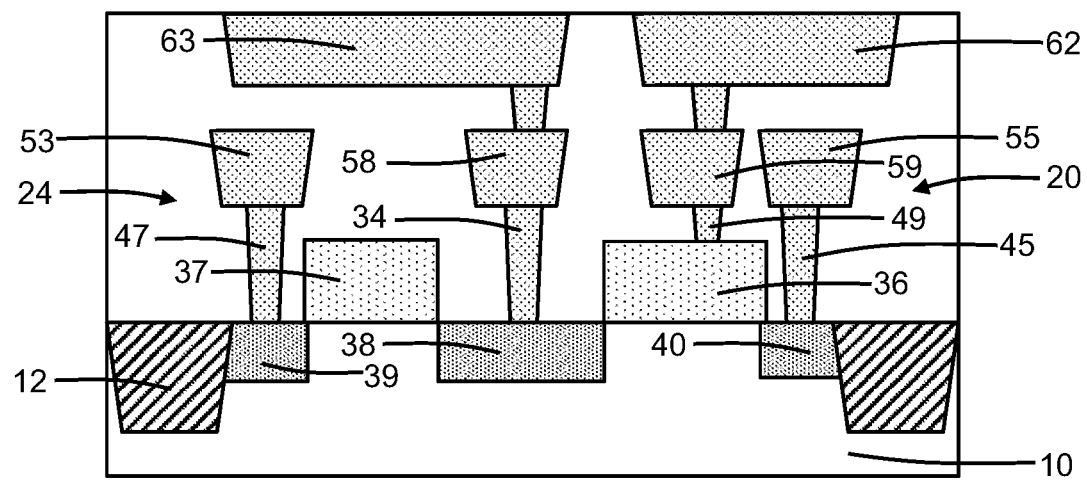
FIG. 2A is a cross-sectional view taken generally along line 2A-2A in FIG. 1.

With reference to FIGS. 1, 2, 2A and in accordance with embodiments of the invention, a substrate 10 includes shallow trench isolation regions 12 that define active regions 14, 16. The substrate 10 may be comprised of a semiconductor material, such as single-crystal silicon. The shallow trench isolation regions 12 electrically isolate the active regions 14, 16 from each other and from adjacent active regions. The shallow trench isolation regions 12 may be formed by patterning trenches in the substrate 10 with lithography and etching processes, depositing a dielectric material (e.g., silicon dioxide) to fill the trenches, and planarizing and/or recessing the dielectric material. The active regions 14, 16 include a well 15 representing a doped region of the substrate 10. In an embodiment, the well 15 may contain a p-type dopant (e.g., boron) introduced by, for example, ion implantation.

Field-effect transistors 18, 20, 22, 24 may be fabricated by front-end-of-line processing as device structures in the active regions 14, 16 of the substrate 10. The field-effect transistors 18, 22 include respective gates 26, 27 and source/drain regions 28, 29, 30 that are formed in the active region 14 of the substrate 10. The field-effect transistors 20, 24 may include respective gates 36, 37 and source/drain regions 38, 39, 40 that are formed in the active region 16 of the substrate 10. The gates 26, 27 and gates 36, 37 may be formed, for example, by patterning a deposited layer of heavily-doped polysilicon with lithography and etching processes, and the source/drain regions 28, 29, 30 and source/drain regions 38, 39, 40 may be formed by a masked ion implantation or diffusion of, for example, an n-type dopant (e.g., arsenic or phosphorus) into the substrate 10. The field-effect transistors 18, 20, 22, 24 may include other structural features, such as a gate dielectric, gate sidewall spacers, etc. The field-effect transistors 18, 20, 22, 24 are formed in the same well 15 in the substrate 10, not in different wells separated by a well of opposite conductivity type as in a conventional SRAM.

The field-effect transistors 18, 20, 22, 24 may provide the n-type metal-oxide-semiconductor (NMOS) transistors that can be used to build a SRAM bitcell, such as a six-transistor (6T) SRAM bitcell. In particular, the field-effect transistor 18 and the field-effect transistor 20 may provide pull-down transistors of the SRAM bitcell, and the field-effect transistor 22 and the field-effect transistor 24 may provide pass-gate transistors of the SRAM bitcell.

Middle-of-line processing and back-end-of-line processing follow to form an interconnect structure having contacts, vias, and wiring that are coupled to the field-effect transistors 18, 20, 22, 24. The interconnect structure is positioned on the substrate 10 over the field-effect transistors 18, 20, 22, 24. The interconnect structure may include a contact level, a first metallization level, and a second metallization level in which the first metallization level is arranged in a vertical direction between the contact level and the second metallization level.

The contact level, which may be formed in a dielectric layer of the interconnect structure, includes a node contact 32 physically and electrically connected to the source/drain region 28, a node contact 34 physically and electrically connected to the source/drain region 38, a contact 44 physically and electrically connected to the source/drain region 29, a contact 45 physically and electrically connected to the source/drain region 40, a bit line contact 46 physically and electrically connected to the source/drain region 30, a bit line contact 47 physically and electrically connected to the source/drain region 39, a pull-down contact 48 physically and electrically connected to the gate 26, and a pull-down contact 49 physically and electrically connected to the gate 36. A word line contact (not shown) is physically and electrically connected to the gate 27, and another word line contact (not shown) is physically and electrically connected to the gate 37.

The first metallization level, which is formed in one or more interlayer dielectric layers of the interconnect structure, includes a metal feature 52 providing a bit line that is connected by the bit line contact 46 to the source/drain region 30, a metal feature 53 providing another bit line that is connected by the bit line contact 47 to the source/drain region 39, metal features 54, 55 that connect the source/drain region 29 and the source/drain region 40 to system ground (Vss), and additional metal features 56, 57, 58, 59.

The second metallization level, which is formed in one or more interlayer dielectric layers of the interconnect structure, includes a metal feature 60 that is connected to the gate 26 of the field-effect transistor 18 by the metal feature 56 and the pull-down contact 48, a metal feature 61 that is connected to the source/drain region 28 by the metal feature 57 and the node contact 32, a metal feature 62 that is connected to the gate 36 of the field-effect transistor 20 by the metal feature 59 and the pull-down contact 49, and a metal feature 63 that is connected to the source/drain region 38 by the metal feature 58 and the node contact 34. The metal features 52-59 of the first metallization level are positioned in a vertical direction between the metal features 60-63 of the second metallization level and the field-effect transistors 18, 20, 22, 24. In an embodiment, the metal features 60-63 in the second metallization level may be comprised of copper. The metal features 60-63 in the second metallization level define pads that are accessible for metal-to-metal bonding to other pads.

The first and second metallization levels of the interconnect structure may be formed by patterning, deposition, and polishing techniques characteristic of a damascene process. Specifically, the one or more interlayer dielectric layers belonging to each metallization level may be deposited and patterned using lithography and etching processes to define trenches that are filled by a planarized metal (e.g., copper) to define the metal features 52-59 and the metal features 60-63.

Figure 3:
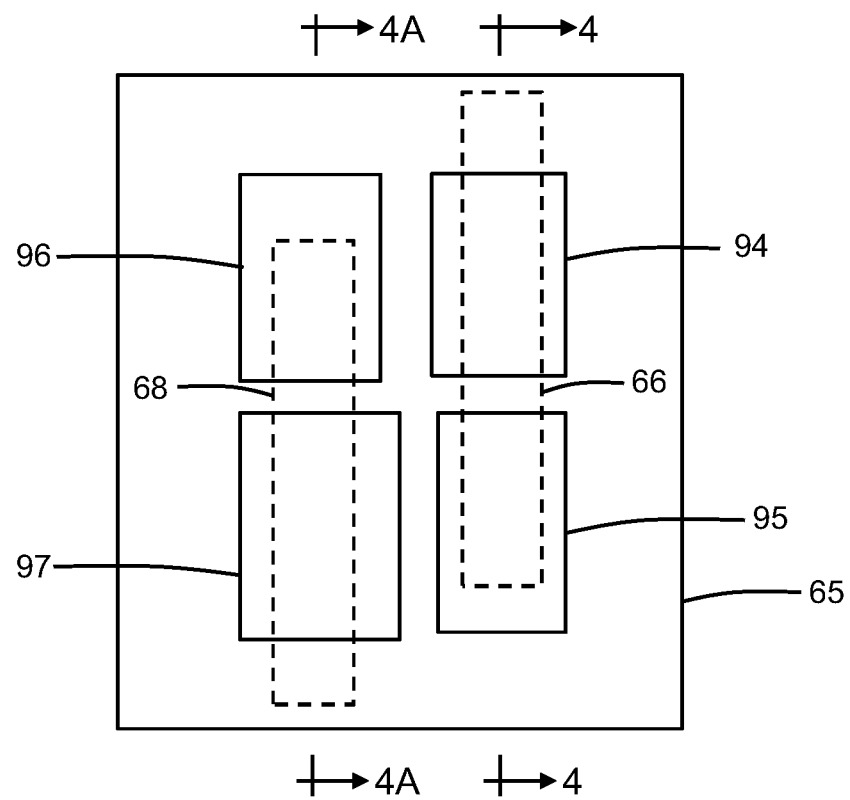
FIG. 3 is a top view of a structure for PMOS transistors that may be used to build a SRAM bit cell in accordance with embodiments of the invention.
Figure 4:
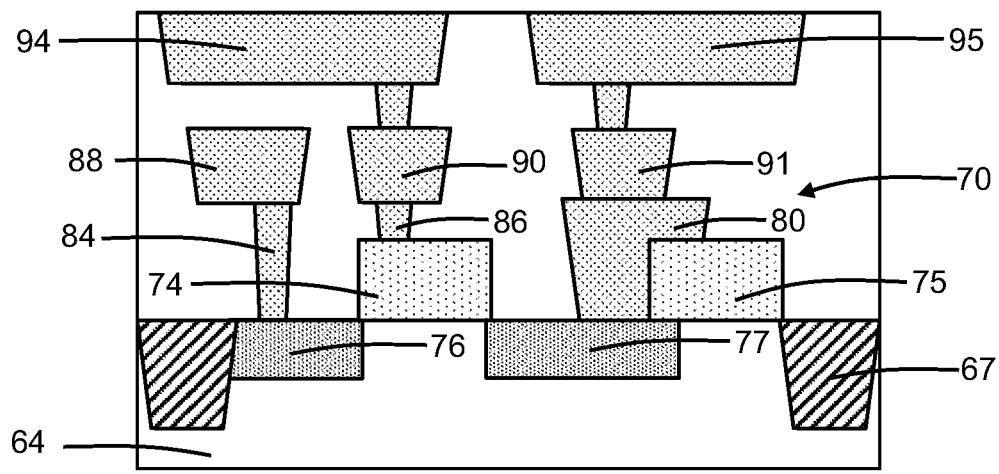
FIG. 4 is a cross-sectional view taken generally along line 4-4 in FIG. 3.
Figure 4A:
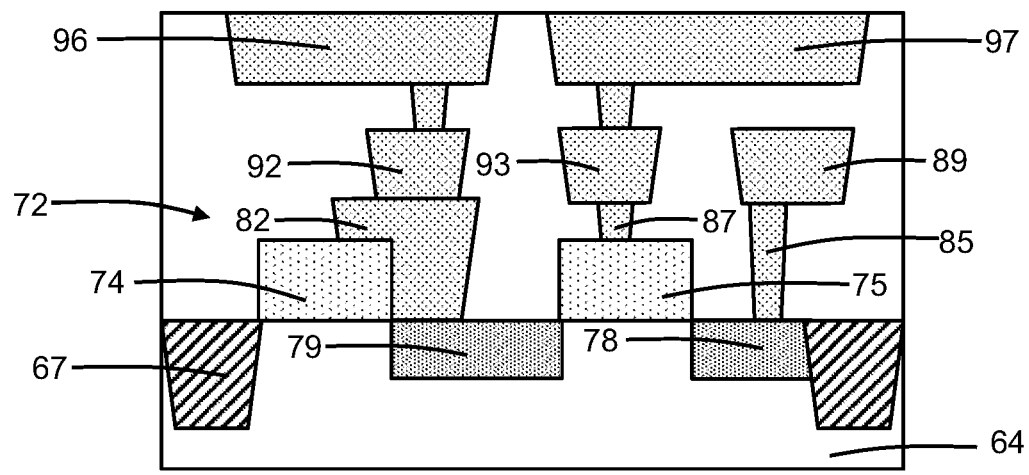
FIG. 4A is a cross-sectional view taken generally along line 4A-4A in FIG. 3.

With reference to FIGS. 3, 4, 4A and in accordance with embodiments of the invention, a substrate 64 includes shallow trench isolation regions 67 that define active regions 66, 68. The substrate 64 may be comprised of a semiconductor material, such as single-crystal silicon. The shallow trench isolation regions 67 electrically isolate the active regions 66, 68 from each other and from adjacent active regions. The shallow trench isolation regions 67 may be formed by patterning trenches in the substrate 64 with lithography and etching processes, depositing a dielectric material (e.g., silicon dioxide) to fill the trenches, and planarizing and/or recessing the dielectric material. The active regions 66, 68 include a well 65 representing a doped region of the substrate 64. In an embodiment, the well 65 may contain an n-type dopant (e.g., phosphorus or arsenic) introduced by, for example, ion implantation.

Field-effect transistors 70, 72 may be fabricated by front-end-of-line processing as device structures in the active regions 66, 68 of the substrate 64. The field-effect transistors 70, 72 may include shared gates 74, 75, source/drain regions 76, 77 that are formed in the active region 66 of the substrate 64, and source/drain regions 78, 79 that are formed in the active region 68 of the substrate 64. The gates 74, 75 may be formed, for example, by patterning a deposited layer of heavily-doped polysilicon with lithography and etching processes, and the source/drain regions 76, 77 and source/drain regions 78, 79 may be formed by a masked ion implantation or diffusion of, for example, a p-type dopant (e.g., boron) into the substrate 64. The field-effect transistors 70, 72 may include other structural elements, such as a gate dielectric, gate sidewall spacers, etc. The field-effect transistors 70, 72 are formed in the well 65, which is not laterally arranged in the substrate 64 between wells of opposite conductivity type as in a conventional SRAM.

The field-effect transistors 70, 72 may provide the p-type metal-oxide-semiconductor (PMOS) transistors that can be used to build an SRAM bitcell. In particular, the field-effect transistor 70 and the field-effect transistor 72 may provide pull-up transistors of the SRAM bitcell. The field-effect transistors 70, 72 are formed using a different substrate 64 than the substrate 10 on which the NMOS transistors of the SRAM bitcell are formed.

Middle-of-line processing and back-end-of-line processing follow to form an interconnect structure having contacts, vias, and wiring that are coupled to the field-effect transistors 70, 72. The interconnect structure is positioned on the substrate 64 over the field-effect transistors 70, 72. The interconnect structure may include a contact level, a first metallization level, and a second metallization level in which the first metallization level is arranged in a vertical direction between the contact level and the second metallization level.

The contact level, which is formed in a dielectric layer of the interconnect structure, includes a node contact 80 physically and electrically connected to the gate 75 and source/drain region 77, a node contact 82 physically and electrically connected to the gate 74 and source/drain region 79, a contact 84 physically and electrically connected to the source/drain region 76, a contact 85 physically and electrically connected to the source/drain region 78, a pull-up contact 86 physically and electrically connected to the gate 74, and a pull-up contact 87 physically and electrically connected to the gate 75.

The first metallization level, which is formed in one or more interlayer dielectric layers of the interconnect structure, includes metal features 88, 89 that connect the source/drain region 76 and the source/drain region 78 to a supply voltage (Vdd), and metal features 90, 91, 92, 93. The second metallization level, which is formed in one or more interlayer dielectric layers of the interconnect structure, includes a metal feature 94 that is connected to the gate 74 of the field-effect transistor 70 by the metal feature 90 and the pull-up contact 86, a metal feature 95 that is connected by the node contact 80 to the gate 75 and source/drain region 77, a metal feature 96 that is connected by the node contact 82 to the gate 74 and source/drain region 79, and a metal feature 97 that is connected to the gate 75 by the metal feature 93 and the pull-up contact 87. The metal features 88-93 of the first metallization level are positioned in a vertical direction between the metal features 94-97 of the second metallization level and the field-effect transistors 70, 72. In an embodiment, the metal features 94-97 in the second metallization level may be comprised of copper. The metal features 94-97 in the second metallization level define pads that are accessible for metal-to-metal bonding to other pads, such as the metal features 60-63 (FIGS. 1, 2, 2A).

The first and second metallization levels of the interconnect structure may be formed by patterning, deposition, and polishing techniques characteristic of a damascene process. Specifically, the one or more dielectric layers belonging to each metallization level may be deposited and patterned using lithography and etching processes to define trenches that are filled by a planarized metal (e.g., copper) to define the metal features 88-93 and the metal features 94-97.

Figure 5:
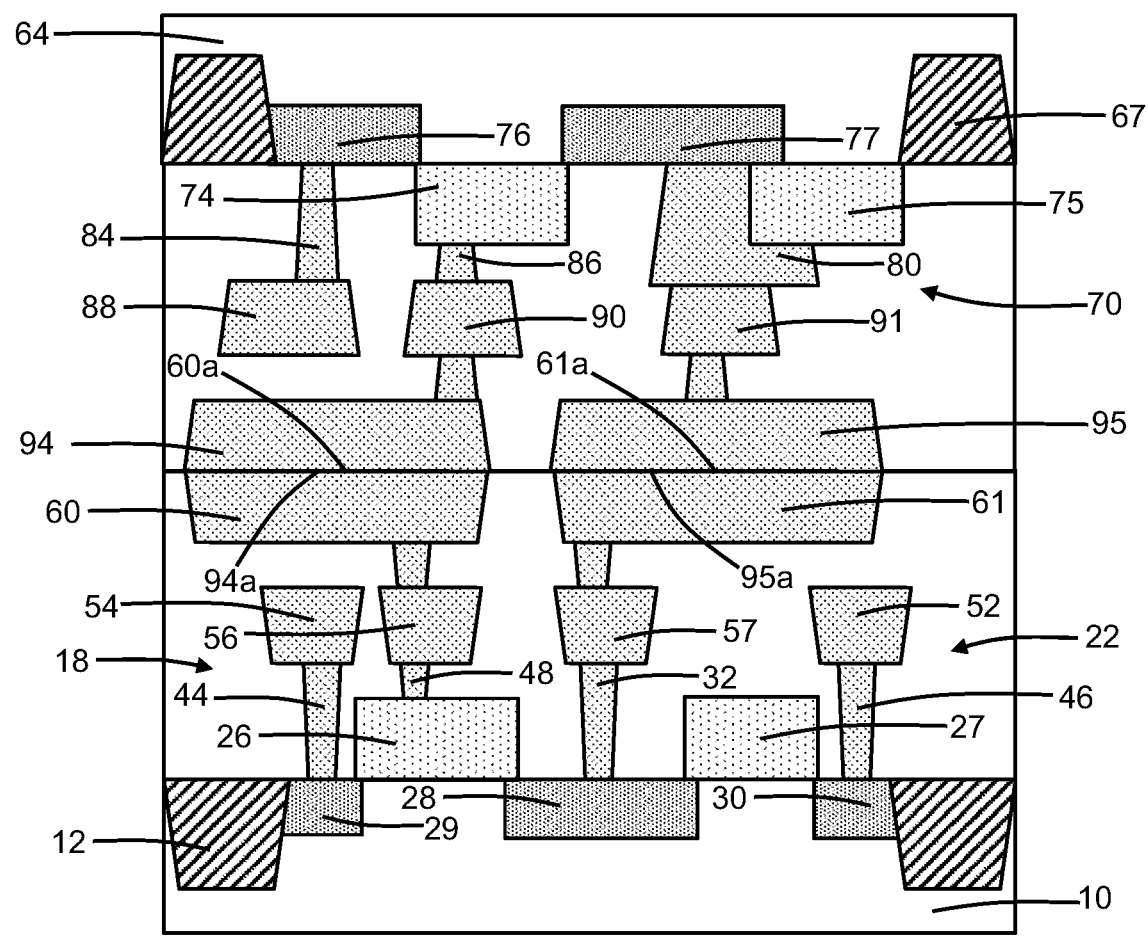
FIGS. 5, 5A are cross-sectional views of an SRAM bitcell built by joining the NMOS transistors of FIGS. 1, 2, 2A and the PMOS transistors of FIGS. 3, 4, 4A.
Figure 5A:
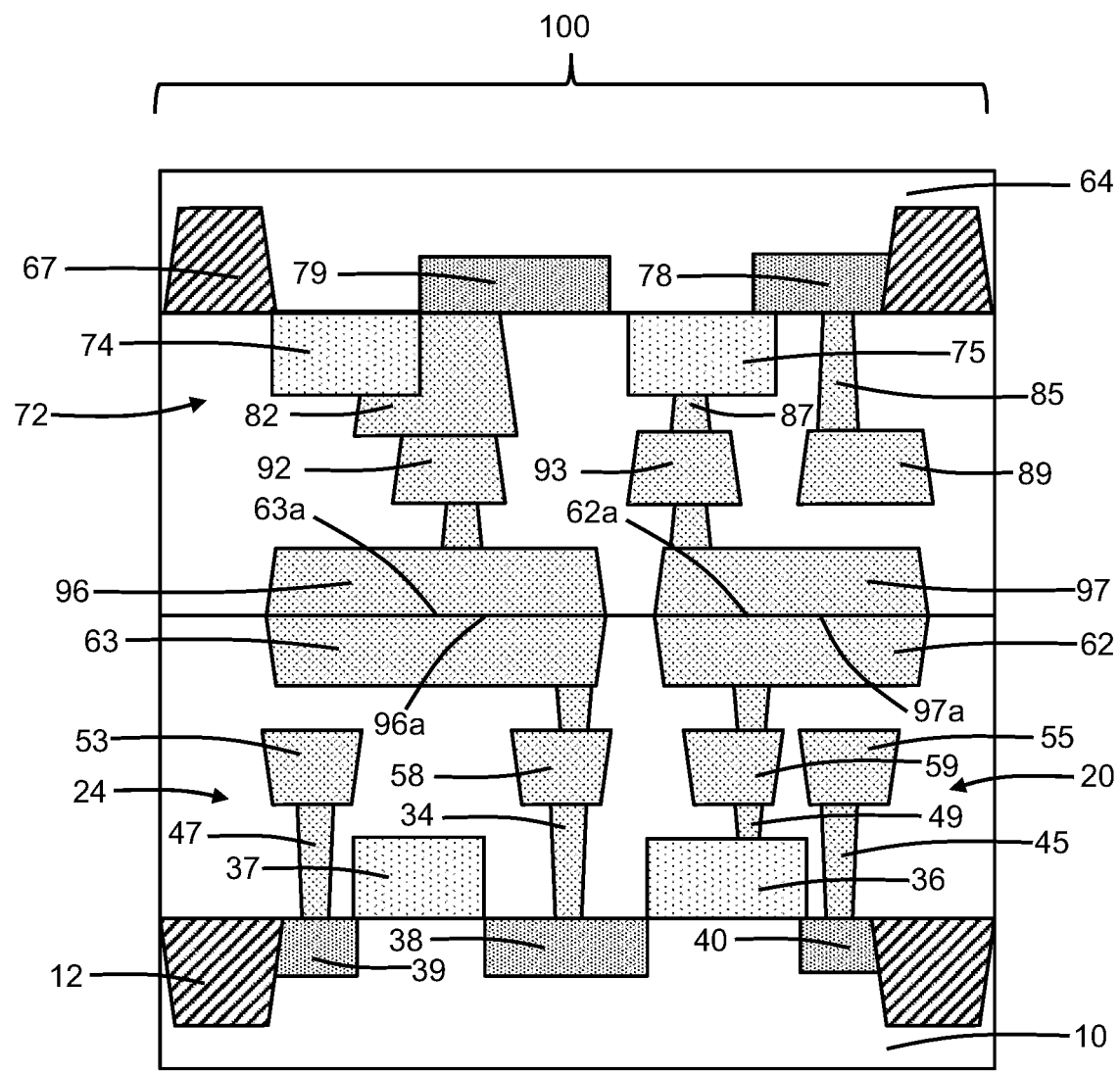

With reference to FIGS. 5, 5A and in accordance with embodiments of the invention, the substrate 64 carrying the PMOS transistors of an SRAM bitcell may be flipped and attached to the substrate 10 carrying the NMOS transistors of the SRAM bitcell. Specifically, the metal features 94, 95 are face-to-face bonded to the metal features 60, 61, and the metal features 96, 97 are face-to-face bonded to the metal features 62, 63 to provide the cross-coupled gates and node connections of the SRAM bitcell. More specifically, a surface 94a of the metal feature 94 is mechanically and electrically connected face-to-face to a surface 60a of the metal feature 60, a surface 95a of the metal feature 95 is mechanically and electrically face-to-face connected to a surface 61a of the metal feature 61, a surface 97a of the metal feature 97 is mechanically and electrically connected face-to-face to a surface 63a of the metal feature 63, and a surface 96a of the metal feature 96 is mechanically and electrically connected face-to-face to a surface 62a of the metal feature 62. The mechanical and electrical connections, which may be provided by direct contact between the involved surfaces, provide the cross-coupled inverters belonging to the SRAM bitcell.

The face-to-face metal feature bonding may be provided by a metal-to-metal bonding technique. In an embodiment, the metal features 94, 95 may be joined by respective physical bonds to the metal features 60, 61, and the metal features 96, 97 may be joined by respective physical bonds to the metal features 62, 63 through direct bonding without the presence of an intermediate layer. The metal features 60, 61 and the metal features 96, 97 may be placed into respective surface-to-surface contacting relationships, and a low temperature thermal treatment or anneal may be performed at a sufficient temperature and for a sufficient duration to generate metal-to-metal bonding. For example, a representative bonding process may include a thermal anneal conducted at a temperature in a range of 350° C. to 450° C. and for a duration of 20 minutes to 60 minutes. Optionally, the substrate 10 and the substrate 64 may be clamped together during the thermal anneal to provide an external applied force for performing thermocompression bonding. The thermal anneal, which may be conducted in the presence or absence of an applied external force, may be performed in a controlled atmosphere containing a non-oxidizing gas, such as nitrogen gas.

The SRAM bitcell is formed with a three-dimensional integration in which the NMOS and PMOS transistors are separately fabricated and then joined by face-to-face metal feature bonding (i.e., three-dimensional (3D) hybrid bonding). The threshold voltage mismatch for the field-effect transistors 18, 20, 22, 24 constituting the NMOS transistors of the SRAM bitcell may be reduced because the field-effect transistors 18, 20, 22, 24 providing the inverters are formed in the same well, not in separate wells as in a conventional SRAM bitcell, which is facilitated by the face-to-face metal feature bonding.

Figure 6:
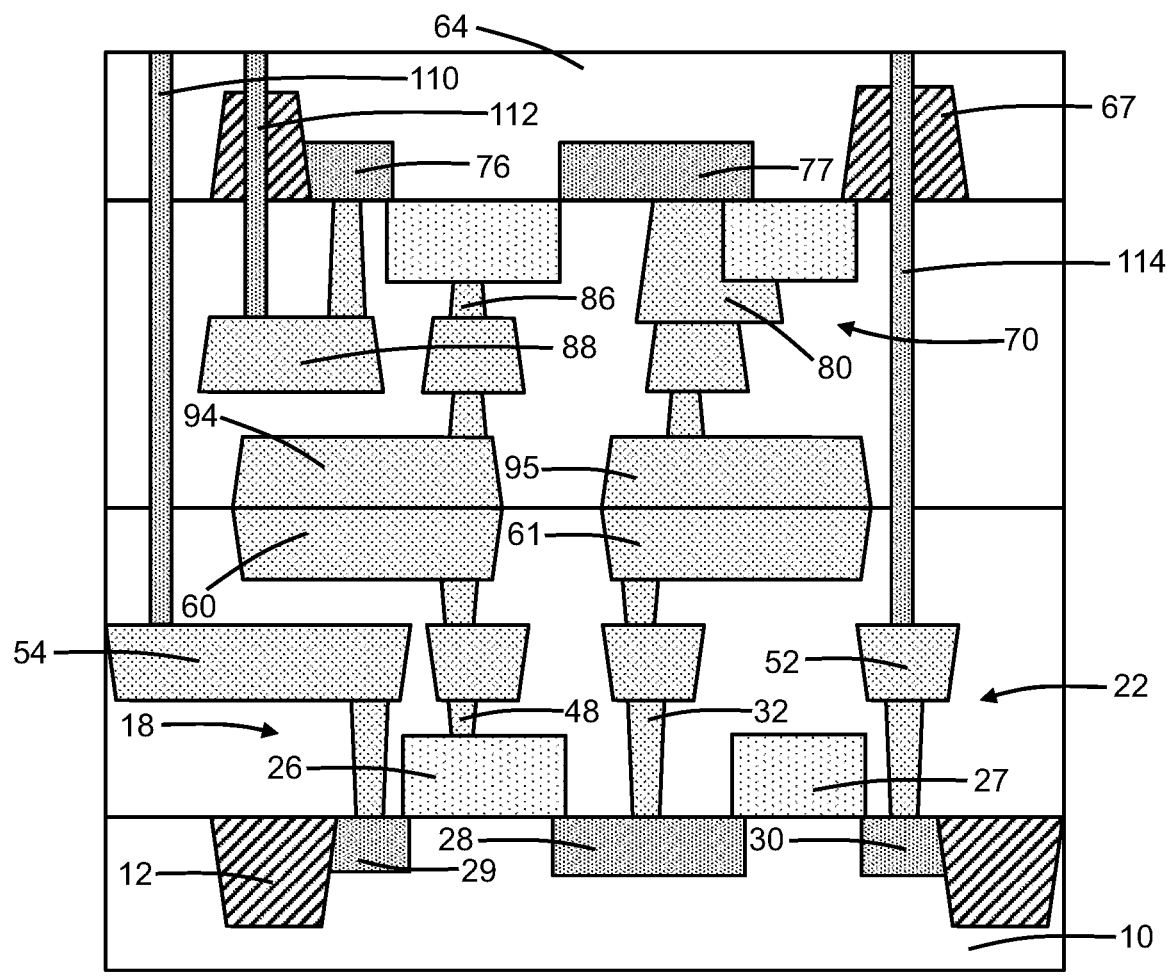
FIG. 6 is a cross-sectional view of an inverter of an SRAM bitcell in accordance with alternative embodiments of the invention.

With reference to FIG. 6 and in accordance with embodiments of the invention, the SRAM bitcell may include inter-tier vias 110, 112, 114 to provide backend routing of electrical connections to the field-effect transistors 18, 22 and field-effect transistor 70. The inter-tier via 110 extends through the substrate 64 and the interconnect structure on substrate 64 to the metal feature 54 of the interconnect structure on the substrate 10. The inter-tier via 112 extends through the substrate 64 to the metal feature 88 of the interconnect structure on substrate 64. The inter-tier via 114 extends through the substrate 64 and the interconnect structure on substrate 64 to the metal feature 52 of the interconnect structure on substrate 10.

In an embodiment, three-dimensional (3-D) via openings may be etched that extend to the metal features 52, 54, 88, and a metal, such as tungsten, may be deposited and planarized to fill the 3-D vias to form the inter-tier vias 110, 112, 114. Backside vias and metallization (not shown) may be formed to provide pads for establishing external connections with the inter-tier vias 110.

While not shown, a set of inter-tier vias similar to the inter-tier vias 110, 112, 114 may be formed that extend to the metal features 53, 55, 89 for backend routing of electrical connections to the field-effect transistors 20, 24 and field-effect transistor 72 of FIG. 5A.

Figure 7:
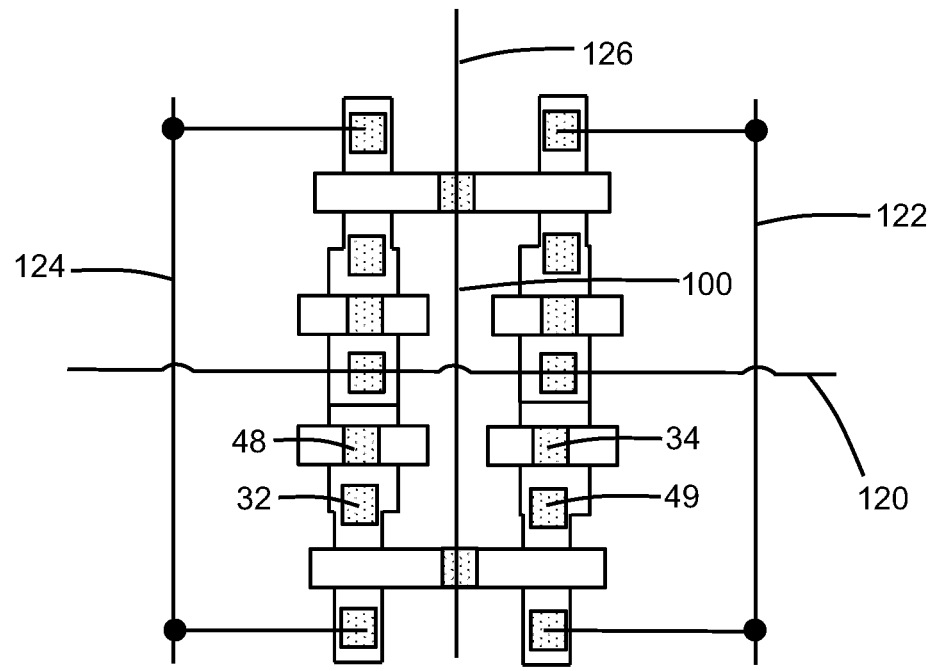
FIGS. 7 and 8 are diagrammatic layout views illustrating the bit line connections, the word line connections, the power connections, and the ground connections for a bitcell array.
Figure 8:
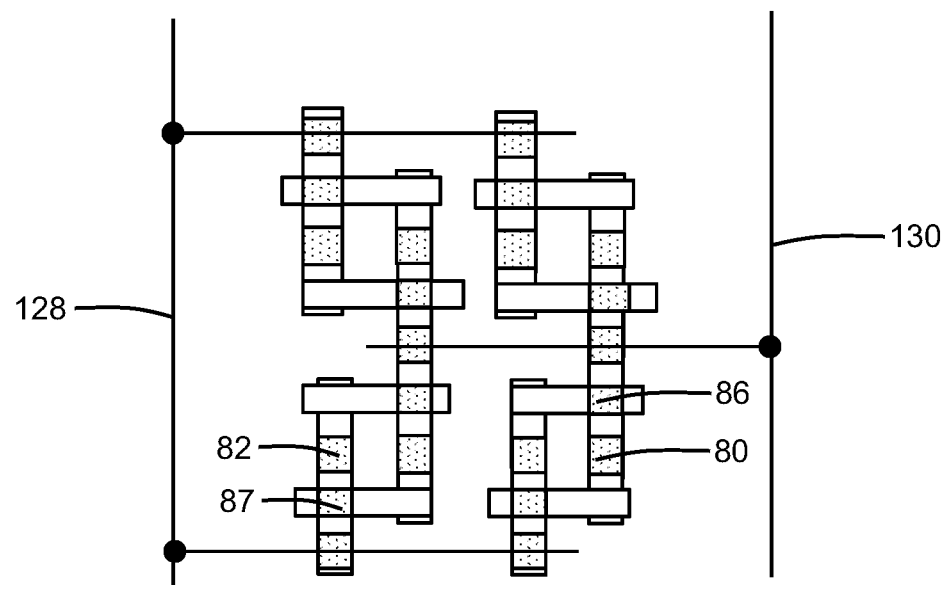

With reference to FIGS. 7, 8 and in accordance with embodiments of the invention, an exemplary routing layout for electrical connections to the NMOS transistors (FIG. 7) and the PMOS transistors (FIG. 8) of a SRAM bitcell array is illustrated. For the NMOS transistors, a ground line 120 is aligned to run in a given direction, and a bit line 122, a bit line 124, and a word line 126 are all aligned to run in a given direction that is transverse to the direction of the ground line 120. The routing of the bit line 122, bit line 124, and word line 126 is selected to avoid crossing the metal features 60-63 used in the face-to-face bonding of the NMOS and PMOS transistors of each SRAM bitcell. In that regard, the metal features 60-63 are laterally offset from the routing paths for the bit line 122, bit line 124, and word line 126. For the PMOS transistors, supply voltage lines 128, 130 are placed to avoid crossing the metal features 94-97 used in the face-to-face bonding of the NMOS and PMOS transistors of each SRAM bitcell. In that regard, the metal features 94-97 are laterally offset in the routing layout from the supply voltage lines 128, 130.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a static random access memory bitcell, the structure comprising:
    a first substrate;
    a second substrate;
    a first n-type field-effect transistor on the first substrate, the first n-type field-effect transistor including a first gate;
    a second n-type field-effect transistor on the first substrate, the second n-type field-effect transistor including a second gate;
    a first p-type field-effect transistor on the second substrate, the first p-type field-effect transistor including a first gate and a first source/drain region;
    a second p-type field-effect transistor on the second substrate, the second p-type field-effect transistor including a second gate and a second source/drain region;
    a first interconnect structure on the first substrate, the first interconnect structure including a first metal feature and a second metal feature, the first metal feature of the first interconnect structure connected to the first gate of the first n-type field-effect transistor, the second metal feature of the first interconnect structure connected to the second gate of the second n-type field-effect transistor, the first metal feature including a first surface, and the second metal feature including a second surface; and
    a second interconnect structure on the second substrate, the second interconnect structure including a first metal feature and a second metal feature, the first metal feature of the second interconnect structure connected to the first gate of the first p-type field-effect transistor, the second metal feature of the second interconnect structure connected to the second gate of the second p-type field-effect transistor, the first metal feature of the second interconnect structure including a first surface that is connected to the first surface of the first metal feature of the first interconnect structure, and the second metal feature of the second interconnect structure including a second surface that is connected to the second surface of the second metal feature of the first interconnect structure,
    wherein the first metal feature of the second interconnect structure is further connected to the first source/drain region of the first p-type field-effect transistor, and the second metal feature of the second interconnect structure is further connected to the second source/drain region of the second p-type field-effect transistor.

2. The structure of claim 1 wherein the first interconnect structure includes a third metal feature, and further comprising:
    an inter-tier via extending through the first substrate to the third metal feature.

3. The structure of claim 2 wherein the first metal feature and the third metal feature are positioned in different metallization levels of the first interconnect structure.

4. The structure of claim 1 wherein the second interconnect structure includes a third metal feature, and further comprising:
    an inter-tier via extending through the first substrate and the first interconnect structure to the third metal feature.

5. The structure of claim 4 wherein the second metal feature and the third metal feature are positioned in different metallization levels of the second interconnect structure.

6. The structure of claim 1 wherein the first interconnect structure includes a third metal feature and a fourth metal feature, and further comprising:
    a bit line connected to the third metal feature; and
    a ground line connected to the fourth metal feature,
    wherein the first metal feature and the second metal feature are laterally offset from the bit line.

7. The structure of claim 6 wherein the ground line is aligned transverse to the bit line.

8. The structure of claim 7 further comprising:
    a word line aligned transverse to the ground line.

9. The structure of claim 1 wherein the second interconnect structure includes a third metal feature, and further comprising:
a supply voltage line connected to the third metal feature, wherein the supply voltage line is laterally offset relative to the third metal feature.

10. The structure of claim 1 wherein the first surface of the first metal feature of the second interconnect structure connected to the first surface of the first metal feature of the first interconnect structure by a first metal-to-metal bond, and the second surface of the second metal feature of the second interconnect structure is connected to the second surface of the second metal feature of the first interconnect structure by a second metal-to-metal bond.

11. The structure of claim 1 wherein the first substrate includes a first active region and a second active region, and further comprising:
a well in the first active region of the first substrate and in the second active region of the first surface substrate, wherein the first n-type field-effect transistor includes a first source/drain region in the first active region, the second n-type field-effect transistor includes a second source/drain region disposed in the second active region, and the first n-type field-effect transistor and the second n-type field-effect transistor share the well.

12. The structure of claim 11 further comprising:
a third n-type field-effect transistor on the first substrate, the third n-type field-effect transistor including a third gate and a third source/drain region; and
a fourth n-type field-effect transistor on the first substrate, the fourth n-type field-effect transistor including a fourth gate and a fourth source/drain region,
wherein the third source/drain region is disposed in the first active region, the fourth source/drain region is disposed in the second active region, and the third n-type field-effect transistor and the fourth n-type field-effect transistor share the well with the first n-type field-effect transistor and the second n-type field-effect transistor.

13. The structure of claim 1 wherein the first n-type field-effect transistor and the second n-type field-effect transistor are pull-down transistors of the static random access memory bitcell, and the first p-type field-effect transistor and the second p-type field-effect transistor are pull-up transistors of the static random access memory bitcell.

14. A method of forming a structure for a static random access memory bitcell, the method comprising:
forming a first n-type field-effect transistor on a first substrate, wherein the first n-type field-effect transistor includes a first gate;
forming a second n-type field-effect transistor on the first substrate, wherein the second n-type field-effect transistor includes a second gate;
forming a first p-type field-effect transistor on a second substrate, wherein the first p-type field-effect transistor includes a first gate;
forming a second p-type field-effect transistor on the second substrate, wherein the second p-type field-effect transistor includes a second gate and a second source/drain region;
forming a first interconnect structure on the first substrate, wherein the first interconnect structure includes a first metal feature and a second metal feature, the first metal feature of the first interconnect structure is connected to the first gate of the first n-type field-effect transistor, the second metal feature of the first interconnect structure is connected to the second gate of the second n-type field-effect transistor, the first metal feature includes a first surface, and the second metal feature includes a second surface;
forming a second interconnect structure on the second substrate, wherein the second interconnect structure includes a first metal feature and a second metal feature, the first metal feature of the second interconnect structure is connected to the first gate of the first p-type field-effect transistor, the second metal feature of the second interconnect structure is connected to the second gate of the second p-type field-effect transistor, the first metal feature of the second interconnect structure includes a first surface that is connected to the first surface of the first metal feature of the first interconnect structure, and the second metal feature of the second interconnect structure includes a second surface that is connected to the second surface of the second metal feature of the first interconnect structure,
wherein the first metal feature of the second interconnect structure is further connected to the first source/drain region of the first p-type field-effect transistor, and the second metal feature of the second interconnect structure is further connected to the second source/drain region of the second p-type field-effect transistor.

15. The method of claim 14 further comprising:
forming a first metal-to-metal bond between the first surface of the first metal feature of the first interconnect structure and the first surface of the first metal feature of the second interconnect structure; and
forming a second metal-to-metal bond between the second surface of the first metal feature of the first interconnect structure and the second surface of the second metal feature of the second interconnect structure.

* * * * *